United States Patent [19]

Ridgway et al.

[11] 4,217,168

[45] Aug. 12, 1980

[54] MAGNETIC CORE FORMED FROM LAMINATIONS

[75] Inventors: Peter C. Ridgway, Staines; Derek F. Case, Sunbury, both of England

[73] Assignee: Data Recording Instruments Limited, Staines, England

[21] Appl. No.: 942,155

[22] Filed: Sep. 14, 1978

[30] Foreign Application Priority Data

Sep. 16, 1977 [GB] United Kingdom ............... 38569/77

[51] Int. Cl.² .......................... C23F 1/02; B44C 1/22; H01F 3/02; H01F 41/02
[52] U.S. Cl. ...................................... 430/320; 29/609; 430/323; 156/661.1; 156/272; 156/264; 156/306.9
[58] Field of Search ........................ 29/609, 604, 603; 336/219; 96/35.1, 38.4, 36.2; 427/43, 48, 130, 131, 132; 156/630, 634, 656, 659, 661, 272, 563, 306

[56] References Cited

U.S. PATENT DOCUMENTS

| | | | |
|---|---|---|---|
| 2,998,583 | 8/1961 | Worcester | 156/656 X |
| 3,436,814 | 4/1969 | Fuller et al. | 156/630 X |
| 3,620,886 | 11/1971 | Sims et al. | 156/272 X |
| 3,894,163 | 7/1975 | Broyde | 427/43 |
| 3,956,043 | 5/1976 | Zahir et al. | 156/634 |

FOREIGN PATENT DOCUMENTS 562539 7/1944 United Kingdom ..................... 156/630

*Primary Examiner*—William A. Powell
*Attorney, Agent, or Firm*—Hane, Roberts, Spiecens & Cohen

[57] ABSTRACT

A method of bonding laminations of a magnetic core is disclosed in which photo-resist material consisting of a co-polymer is applied as a film to a sheet of magnetic material to define lamination shapes to enable the laminations to be formed by etching. The film of photo-resist material on the laminations is then utilized to bond the laminations together in a stack. In order to permit the core to operate at temperatures higher than the softening temperature of the photo-resist material, the bonded stack is irradiated to cause changes to the bonding material such that the material does not soften at the operating temperature of the core.

6 Claims, 1 Drawing Figure

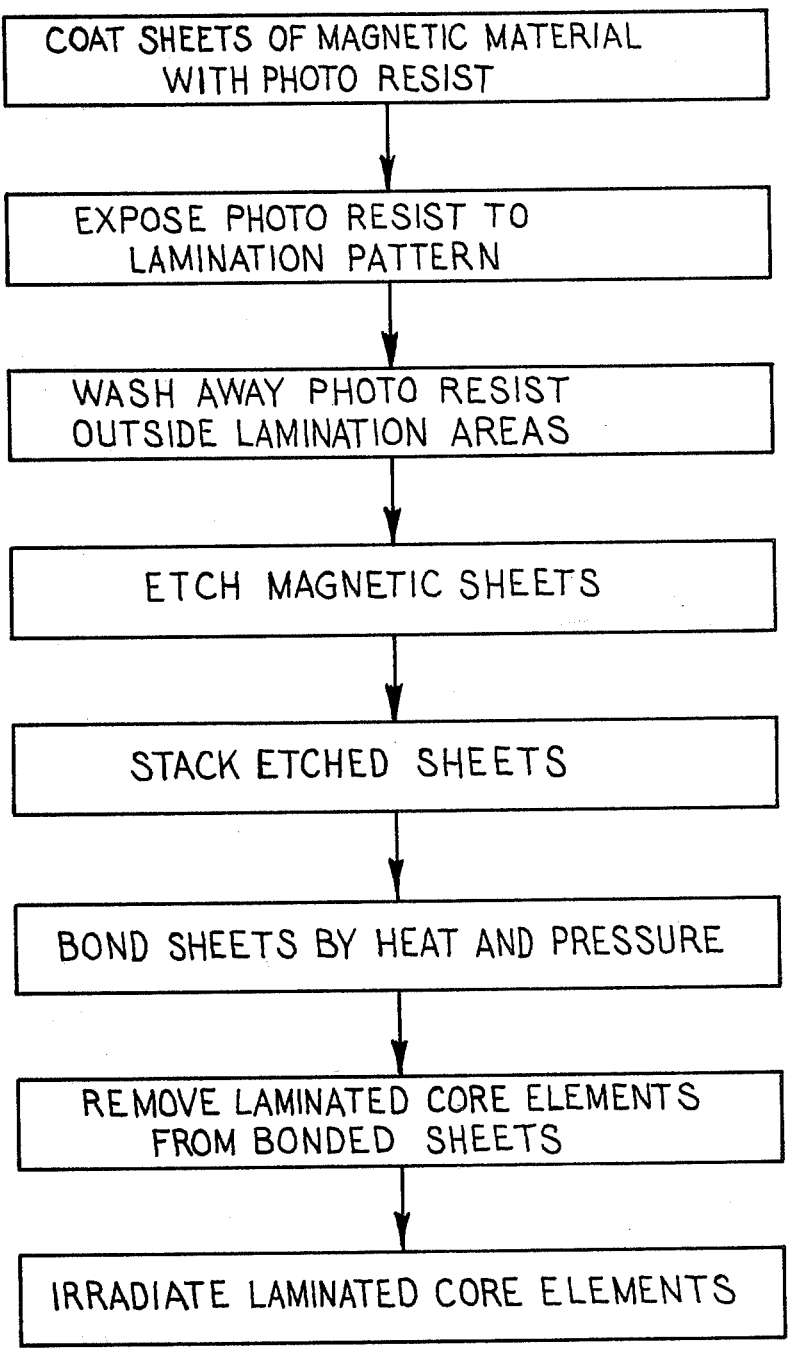

MAGNETIC CORE FORMED FROM LAMINATIONS

FIELD OF THE INVENTION

This invention relates to the manufacture of laminated articles and in particular to the manufacture of laminated cores for magnetic transducer heads.

The cores of magnetic transducer heads often are constructed of two elements, one of so called C shaped and the other of so called I shape. These elements are secured in a mounting in such manner as to provide a closed loop path for magnetic flux but the elements are spaced from one another to provide a non-magnetic transducing gap. In operation, the magnetic head is positioned so that a recording medium, such as a magnetic tape, passes across the gap. The presence of the gap causes the magnetic flux in the core to extend into the recording medium in the vicinity of the gap. A coil is wound on the C element and is electromagnetically coupled with the core. Electrical energisation of the coil is effective to induce magnetic flux in the core and thereby enable signals to be recorded as magnetised areas on the records medium and previously recorded signals are effective to produce flux in the core which induces an electrical signal in the coils. Thus the head may be used for recording on and reading from the magnetic recording medium.

To meet present day requirements to record signals at a very high packing density on the recording medium it is necessary to manufacture the cores with very small physical dimensions. For example, it is common to provide nine separate recorded tracks occupying an overall track width of one inch or less. The increased demands for packing density requires the use of higher frequencies. This, in turn, requires thinner laminations when the heads are of a laminated construction, so as to counteract eddy current effects.

When forming such cores from a plurality of laminations of the magnetic material the laminations are frequently formed from sheet material, currently of the order of 0.001 inch thick, by an etching process involving the use of a photo-resist, coated on the material. With future requirements to increase the frequency of operation it is expected that the thickness of the laminations will need to be reduced, for example to 0.0005 inches.

After the sheets have been etched to provide the required lamination shapes the requisite number of sheets are bonded together by providing a layer of bonding material between adjacent sheets to provide a stack of the desired thickness. It will be appreciated that, in practice, it is necessary to have bonding layers between the sheets which are appreciably thinner than the thickness of the laminations.

In the Applicant's process this bonding together uses the material of the photo resist as the bonding material and effects the bonding by subjecting the stack to a combined pressure and heating stage. This use of the photo-resist is convenient but suffers from the fact that the photo-resist softens with rise in temperature and therefore limits the use of heads constructed with such cores to operational environments in which the temperature does not exceed 40° C. and to storage environment in which the temperature does not exceed 50° C.

These heads therefore are suitable only for use in conventionally expected environmental conditions such as one expects to meet in relation to many industrial and commercial computer installations.

For more demanding applications, where it is required that the magnetic heads should operate at higher temperatures it has been the practice, after etching the lamination sheets, to remove the resist and to use a suitable resin which will withstand these higher temperatures, to effect the bonding so as to avoid dimensional instability and relative movement between laminations due to bonding associated with the use of the photo resist material for bonding the laminations. In practice, in addition to the need to remove the photo resist from the laminations, it has been found inconvenient to apply such resins in thin layers due to the fact that such resin adhesives comprise a two component mixture and the mixture of the components has a relatively short life during which it can be used.

SUMMARY OF THE INVENTION

According to the present invention a method of manufacturing a laminated magnetic core for operation at a predetermined temperature includes the steps of providing a plurality of laminations of magnetic material; forming a film of a co-polymer on said laminations; said co-polymer being subject to softening at said predetermined temperature; assembling a stack of the laminations with the films of co-polymer interposed between said laminations and causing the films to bond the laminations together; and then subjecting the bonded stack to the effects of high energy radiation to produce a change in the co-polymer effective to result in the production of a material bonding the laminations which is not subject to softening at said predetermined temperature.

Preferably the co-polymer used in the method is an isoprene co-polymer. Also it is convenient to use a co-polymer which is suitable for use as a photo resist so that it may be applied to areas of a sheet of magnetic material which is then etched to form individual laminations. The shape of the areas being that desired for the laminations. After etching the photo resist film is utilised to bond the laminations together.

BRIEF DESCRIPTION OF THE DRAWING

A method in accordance with the invention will now be described, by way of example, with reference to the accompanying drawing which is a flow chart of the method.

DESCRIPTION OF THE PREFERRED METHOD

Referring to the flow chart shown in the drawing a plurality of sheets of magnetic material such as Mu-metal of the order of 0.001 inch thick are coated with a film, of a photo resist material consisting of an isprene co-polymer which is sensitive to light. The film is applied to a substantially uniform thickness of the order of 0.0001 inch on both surfaces of the sheets. A preferred photo resist material is that marketed as "Waycoat 450" and is applied in a mixture consisting of 60% resist material and 40% thinners PF. These materials are marketed by Hunt Chemical Corporation, New Jersey, USA.

Each of the coated sheets is exposed to a pattern of light which defines an array of required core element laminations. Both sides of the sheets are exposed, the pattern on one side being inverted relative to that on the other side and the patterns being positioned precisely in correlation with one another. After exposure, the photo resist material outside the areas of the laminations remains soluble and is removed by washing in a suitable solvent, thereby leaving areas on the sheets, corresponding to the shapes of the required laminations, which are protected on both faces by a film of the photo resist material.

The sheets are then subjected to an etching process which removes the material not protected by the resist and hence a plurality of laminations are produced from each sheet. For ease of processing and handling the laminations, the pattern of light to which the photo resist was exposed preferably is such as to define narrow strips, joining each lamination area to a frame area on the sheet. Thus the etching step results in the production of an array of laminations connected by strips to a supporting frame.

A plurality of the etched sheets are stacked together and are firmly pressed together. The stack is then heated for 1¾ hours at 225° C. to cause the abutting films of photo resist to adhere together and hence bond the sheets together. During the pressing and heating of the stack of sheets, thickness of the photo resist between the sheets is reduced by approximately 50% from 0.0002 inches to a dimension of the order of 100 to 75 micro inches.

The portions of the bonded sheets consisting of the bonded laminations are broken away from the frame and connecting strips.

These bonded stacks of laminations each form an element for a magnetic core and where it is desired that the core should have a specified thickness, as is the case of cores for magnetic transducing heads in which the track width of the head must lie with specified tolerances, the bonded stacks are lapped or otherwise machined to the required thickness.

As mentioned hereinbefore, the material of the photo resist, while being convenient to apply to the sheets of magnetic material as a thin film, unfortunately softens at temperatures such as 80° C. at which it may be desired to operate the magnetic head in which the laminated core elements will be embodied. Such softening can result in the thickness of the core changing and relative sliding of the laminations. As a result the dimensions of the non-magnetic gap are liable to change.

In order to overcome the problems associated with the softening of the photo resist material at operating temperatures of the order of 80° C. the bonded laminated core elements are subjected to high energy irradiation. A suitable source of irradiation is available under the commercial identification AECL Cobalt - 60 Gammacell irradiator, which is able to provide irradiation consisting of 1-2 Mev gamma-ray photons. The laminated core elements are subjected to irradiation for a sufficient period of time such that they receive a dose effective to cause cross-linking of the copolymer photo resist bonding the laminations and thereby ensure that the bonding material does not soften at the desired operating temperature of the core element. The dose of irradiation may be of the order of 1 to 5 Megarads and with the above mentioned irradiator such doses can be obtained in periods of 2 to 10 hours respectively.

We claim:

1. A method of manufacturing a laminated magnetic core for operation at temperatures up to a predetermined temperature including the steps of providing a plurality of laminations of magnetic material; forming a film of a co-polymer on said laminations; said co-polymer being subject to softening at said predetermined temperature; assembling a stack of the laminations with the films of co-polymer interposed between said laminations and causing the films to bond the laminations together; and then subjecting the bonded stack to the effects of high energy radiation to produce a change in the co-polymer effective to result in the production of a material bonding the laminations which is not subject to softening at said predetermined temperature.

2. A method as claimed in claim 1 in which said film consists of an isoprene co-polymer.

3. A method as claimed in claim 1 in which the film consists of an isoprene co-polymer which is photo sensitive.

4. A method as claimed in claim 3 including the steps of coating at least one sheet of magnetic material with a film of photo sensitive isoprene co-polymer; exposing the film to a pattern of light defining the shape of at least one lamination; washing the sheet to remove those parts of the film outside the lamination while leaving the lamination coated with the film; and forming the lamination or laminations by subjecting the sheet to an etching process.

5. A method as claimed in claim 4 in which the stack of laminations is bonded by subjecting the stack to pressure and heat.

6. A method as claimed in claim 1 in which the bonded stack of laminations is subjected to an irradiation dose of between 1 and 5 Megarads.

* * * * *